(12) United States Patent
Kang et al.

(10) Patent No.: US 8,198,543 B2
(45) Date of Patent: Jun. 12, 2012

(54) RIGID-FLEXIBLE CIRCUIT BOARD AND METHOD OF MANUFACTURING THE SAME

(75) Inventors: Jung Eun Kang, Gyunggi-do (KR); Seog Moon Choi, Seoul (KR); Tae Hoon Kim, Gyunggi-do (KR); Young Ki Lee, Gyunggi-do (KR); Hye Sook Shin, Gyunggi-do (KR); Chang Hyun Lim, Seoul (KR)

(73) Assignee: Samsung Electro-Mechanics Co., Ltd, Suwon, Gyunggi-Do (KR)

( * ) Notice: Subject to any disclaimer, the term of this patent is extended or adjusted under 35 U.S.C. 154(b) by 221 days.

(21) Appl. No.: 12/618,726

(22) Filed: Nov. 14, 2009

(65) Prior Publication Data

US 2011/0075374 A1    Mar. 31, 2011

(30) Foreign Application Priority Data

Sep. 25, 2009    (KR) .................. 10-2009-0091198

(51) Int. Cl.
*H05K 1/00*    (2006.01)
(52) U.S. Cl. ........ 174/254; 174/250; 174/260; 174/261; 361/749; 361/750; 361/751; 361/792; 29/829; 29/830; 29/846
(58) Field of Classification Search .......... 174/250–266; 361/704–717, 719–724, 730–736, 748–757, 361/760–767, 780–798; 257/686–698, 700–727, 257/737, 777–779; 29/825–846, 850–854, 29/890.03; 428/138, 192, 209; 216/13; 156/247, 156/272.8; 438/612, 616
See application file for complete search history.

(56) References Cited

U.S. PATENT DOCUMENTS

| | | | | |
|---|---|---|---|---|
| 4,338,149 A | * | 7/1982 | Quaschner | 156/248 |
| 4,687,695 A | * | 8/1987 | Hamby | 428/192 |
| 4,931,134 A | * | 6/1990 | Hatkevitz et al. | 216/17 |
| 5,004,639 A | * | 4/1991 | Desai | 428/138 |
| 5,072,074 A | * | 12/1991 | DeMaso et al. | 174/254 |
| 5,093,761 A | * | 3/1992 | Ozaki | 361/792 |
| 5,121,297 A | * | 6/1992 | Haas | 361/751 |
| 5,144,742 A | * | 9/1992 | Lucas et al. | 29/830 |
| 5,175,047 A | * | 12/1992 | McKenney et al. | 428/209 |
| 5,178,318 A | * | 1/1993 | Edwin et al. | 228/180.22 |
| 5,206,463 A | * | 4/1993 | DeMaso et al. | 174/254 |
| 5,262,594 A | * | 11/1993 | Edwin et al. | 174/254 |

(Continued)

FOREIGN PATENT DOCUMENTS

JP    02006173477 A    *    6/2006
JP    02008300889 A    *    12/2008

*Primary Examiner* — Michail V Datskovskiy
(74) *Attorney, Agent, or Firm* — Blakely Sokoloff Taylor & Zafman LLP

(57) ABSTRACT

Disclosed is a rigid-flexible circuit board, which includes a rigid region and a flexible region, the rigid region including a flexible substrate having a first circuit layer on both surfaces thereof, a metal core substrate formed on the flexible substrate and having a second circuit layer on both surfaces thereof, and an adhesive layer disposed between the flexible substrate and the metal core substrate, wherein the metal core substrate includes a metal core having a through hole, and an insulating layer formed on a surface of the metal core, so that the rigid region and the flexible region are thermally separated from each other and heat dissipation properties of the rigid region are improved. A method of manufacturing the rigid-flexible circuit board is also provided.

17 Claims, 7 Drawing Sheets

U.S. PATENT DOCUMENTS

| | | | |
|---|---|---|---|
| 5,499,444 A * | 3/1996 | Doane et al. | 29/830 |
| 6,099,745 A * | 8/2000 | McKenney et al. | 216/13 |
| 6,288,343 B1 * | 9/2001 | Ahn et al. | 174/254 |
| 6,841,738 B2 * | 1/2005 | Michiwaki et al. | 174/254 |
| 7,423,219 B2 * | 9/2008 | Kawaguchi et al. | 174/254 |
| 2008/0047135 A1 * | 2/2008 | Arnold | 29/829 |
| 2009/0232925 A1 * | 9/2009 | Lin et al. | 425/306 |
| 2010/0307899 A1 * | 12/2010 | Puri et al. | 200/329 |

* cited by examiner

RIGID-FLEXIBLE CIRCUIT BOARD AND METHOD OF MANUFACTURING THE SAME

CROSS REFERENCE TO RELATED APPLICATION

This application claims the benefit of Korean Patent Application No. 10-2009-0091198, filed Sep. 25, 2009, entitled "A rigid-flexible circuit board and a method of manufacturing the same", which is hereby incorporated by reference in its entirety into this application.

BACKGROUND OF THE INVENTION

1. Technical Field

The present invention relates to a rigid-flexible circuit board and a method of manufacturing the same.

2. Description of the Related Art

Alongside the recent advancement of the electronics industry is a drastically increasing demand for electronic parts with increased functionality. Circuit boards which mount electronic parts which are lightweight, slim, short and small should be able to integrate many electronic products on the small area thereof.

However, operation of the electronic part generates heat which undesirably deteriorates performance of the electronic part. Thus, circuit boards having improved heat dissipation properties are being researched.

FIG. 1 is a cross-sectional view showing a conventional heat dissipating circuit board, and FIG. 2 is a top plan view showing the heat dissipating circuit board of FIG. 1. With reference to FIGS. 1 and 2, the conventional heat dissipating circuit board and the method of manufacturing the same are described below.

First, a metal core 11 is subjected to anodizing treatment which forms an insulating layer 12.

Next, a circuit layer 13 is formed on the insulating layer 12.

Next, an electronic device including a heating device 14 and a heat-weak device 15 is disposed on the insulating layer 12 having the circuit layer 13 formed thereon.

The conventional heat dissipating circuit board is manufactured by the above procedures.

In the case of the conventional heat dissipating circuit board, because the metal to transfers heat very effectively, heat generated by the heating device 14 is dissipated to the outside through the insulating layer 12 and the metal core 11. Thus, the electronic device formed on the heat dissipating circuit board is not subjected to comparatively high heat, and problems of the performance of the electronic device getting reduced are solved.

However, the conventional heat dissipating circuit board is problematic in that heat generated from the heating device 14 is transferred to the heat-weak device 15 formed on the insulating layer 12 through the insulating layer 12 and the metal core 11. If heat is applied to the heat-weak device 15, performance of the heat-weak device 15 is deteriorated. Furthermore, in the case where heat is very high, destruction of the heat-weak device 15 may be caused, undesirably reducing the total reliability of the product.

Moreover, the use of the metal substrate undesirably lowers the degree of freedom with which the product may be designed.

SUMMARY OF THE INVENTION

Accordingly, the present invention has been made keeping in mind the problems encountered in the related art and the present invention is intended to provide a rigid-flexible circuit board which protects a heat-weak device from heat generated by a heating device, and also to provide a method of manufacturing the same.

Also the present invention is intended to provide a rigid-flexible circuit board which uses a metal substrate thus improving heat dissipation properties and increasing the degree of freedom with which a product may be designed, and also to provide a method of manufacturing the same.

An aspect of the present invention provides a rigid-flexible circuit board including a rigid region and a flexible region, in which the rigid region includes a flexible substrate having a first circuit layer on both surfaces thereof, a metal core substrate formed on the to flexible substrate and having a second circuit layer on both surfaces thereof, the metal core substrate including a metal core having a through hole and an insulating layer formed on a surface of the metal core, and an adhesive layer disposed between the flexible substrate and the metal core substrate.

In this aspect, the rigid-flexible circuit board may further include a connection means for connecting the first circuit layer and the second circuit layer.

The first circuit layer or the second circuit layer may have a stepped shape, and the connection means may include a protrusion of the first circuit layer or the second circuit layer which has the stepped shape.

The connection means may include a bump.

In this aspect, the metal core may be composed of a metal including aluminum, and the insulating layer may be composed of a metal anodizing layer.

In this aspect, the flexible substrate may include polyimide.

In this aspect, the rigid-flexible circuit board may further include a heating device mounted on the rigid region and a heat-weak device mounted on the flexible region.

Alternatively, the rigid-flexible circuit board may further include a heating device mounted on one surface of the rigid region and a heat-weak device mounted on the other surface of the rigid region.

Another aspect of the present invention provides a method of manufacturing the rigid-flexible circuit board, including (A) providing a flexible substrate having a first circuit layer on both surfaces thereof, (B) forming an insulating layer on a surface of a metal core having a through hole, and forming a second circuit layer on the metal core having the insulating layer, thus providing a metal core substrate having the second circuit layer on both surfaces thereof, and (C) forming an adhesive layer on both surfaces of a portion which is to be a rigid region among a rigid region and a flexible region of the flexible substrate having the first circuit layer, and forming the metal core substrate having to the second circuit layer on the adhesive layer.

In this aspect, the method may further include (D) forming a protective layer on both surfaces of a portion which is to be the flexible region among the rigid region and the flexible region of the flexible substrate having the first circuit layer.

In this aspect, the method may further include connecting the first circuit layer and the second circuit layer using a connection means.

The first circuit layer or the second circuit layer may have a stepped shape, and the connection means may include a protrusion of the first circuit layer or the second circuit layer which has the stepped shape.

The connection means may include a bump.

In this aspect, (B) may include (B1) providing a metal core comprising a metal including aluminum, (B2) anodizing the metal core, thus forming an insulating layer comprising a metal anodizing layer on the metal core, and (B3) forming the second circuit layer on the metal core having the insulating layer.

In this aspect, the flexible substrate may include polyimide.

In this aspect, the method may further include (D) disposing a heating device on the rigid region and disposing a heat-weak device on the flexible region.

Alternatively, the method may further include (D) disposing a heating device on one surface of the rigid region and disposing a heat-weak device on the other surface of the rigid region.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Figure 1:
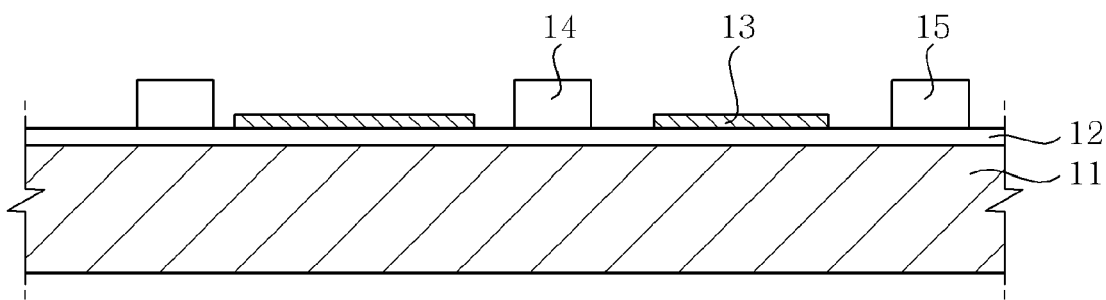
FIG. 1 is a cross-sectional view showing a conventional heat dissipating circuit board.
Figure 2:
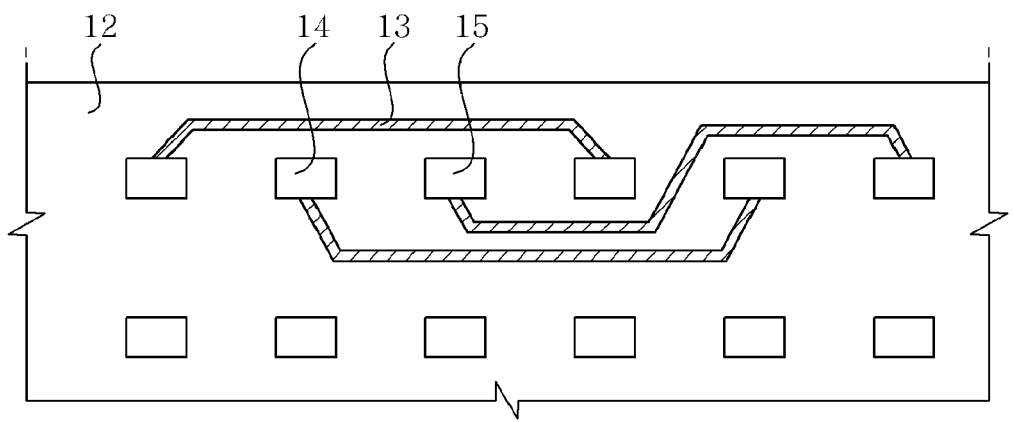
FIG. 2 is a top plan view showing the heat dissipating circuit board of FIG. 1.

Hereinafter, embodiments of the present invention will be described in detail while referring to the accompanying drawings. Throughout the drawings, the same reference numerals are used to refer to the same or similar elements. In the description, the terms "first", "second" and so on are used only to distinguish one element from another element, and the elements are not defined by the above terms. Moreover, descriptions of known techniques, even if they are pertinent to the present invention, are regarded as unnecessary and may be omitted in so far as they would make the characteristics of the invention unclear and muddy the description.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately to define the concept implied by the term to best describe the method he or she knows for carrying out the invention.

Rigid-Flexible Circuit Board

Figure 3:
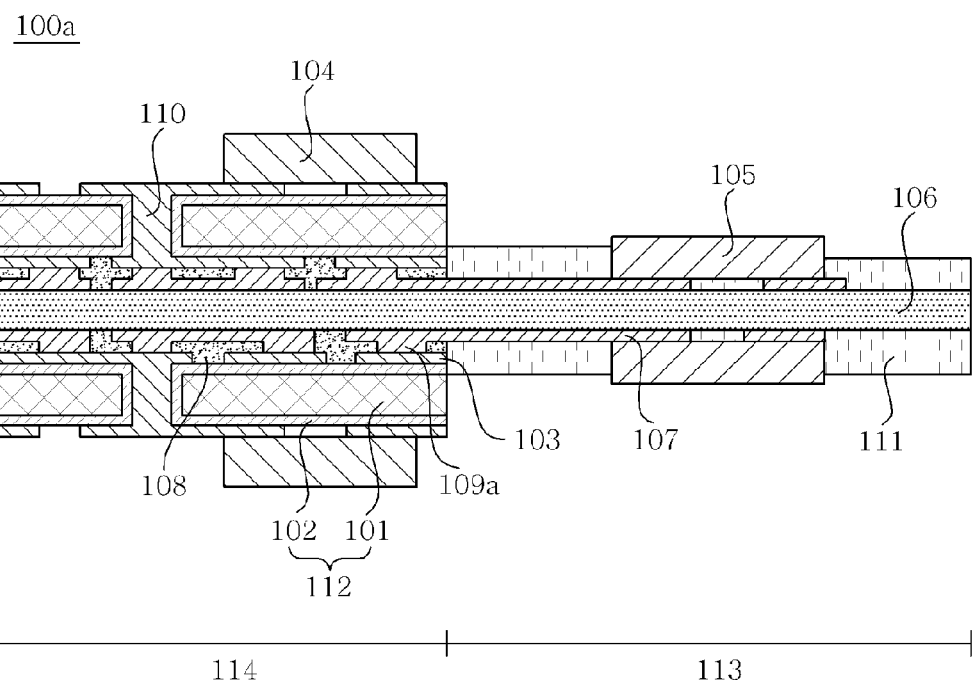
FIG. 3 is a cross-sectional view showing a rigid-flexible circuit board according to a first embodiment of the present invention.

FIG. 3 is a cross-sectional view showing a rigid-flexible circuit board 100a according to a first embodiment of the present invention. With reference to this drawing, the rigid-flexible circuit board 100a according to the present embodiment is described below.

As shown in FIG. 3, the rigid-flexible circuit board 100a according to the present embodiment generally includes a rigid region 114 and a flexible region 113, thus exhibiting thermal separation effects.

Specifically, the flexible region 113 includes a flexible substrate 106 having a first circuit layer 107 formed thereon.

The flexible substrate 106 has the functionality of an insulating material and manifests excellent flexibility, and thus increases the degree of freedom of the design of the flexible region 113. An example of a material used for the flexible substrate 106 may include but is not limited to polyimide. Any material may be used as long as it is an insulating material having high flexibility.

The rigid region 114 includes, in addition to the flexible substrate 106 having the first circuit layer 107 formed thereon, a metal core substrate 112 bonded onto the flexible substrate 106 using an adhesive layer 108, and a second circuit layer 103 formed on the metal core substrate 112.

The metal core substrate 112 includes a metal core 101 having a through hole 110 formed therein and an insulating layer 102 formed on the surface of the metal core 101. The metal core 101 may be a metal substrate which includes aluminum (Al), and the insulating layer 102 may be a metal anodizing layer formed by anodizing the metal core 101. When the metal substrate including Al is anodized, the rigid-flexible circuit board 100a having excellent heat dissipation effects may be obtained. The insulating layer 102 is formed on both the entire surface of the metal core 101 and the inner surface of the through hole 110.

The flexible substrate 106 having the first circuit layer 107 and the metal core substrate 112 having the second circuit layer 103 are bonded to each other using the adhesive layer 108. The adhesive layer 108 may include for example an adhesive for adhering a circuit board, or a prepreg insulating layer. Alternatively, any material may be used as long as it has the functionality of the adhesive and functionality of the insulating material. The metal core substrate 112 may be bonded only to one surface of the flexible substrate 106, or alternatively may be bonded to both surfaces of the flexible substrate 106.

The first circuit layer 107 and the second circuit layer 103 may be electrically connected to each other using a connection means. For example, when the first circuit layer 107 is formed in a stepped shape, the protrusion 109a of the first circuit layer 107 may be connected to the second circuit layer 103. In contrast, the second circuit layer 103 may be formed in a stepped shape and thus may be connected to the first circuit layer 107. In place of the stepped shape, a bump may be provided so as to electrically connect the first circuit layer 107 and the second circuit layer 103 to each other.

Although FIG. 3 illustrates the formation of the first circuit layer 107 in a stepped shape so that the protrusion 109a of the first circuit layer 107 is electrically connected to the second circuit layer 103, the present invention is not limited thereto. Also, the first circuit layer 107 and the second circuit layer 103 may be connected to each other using any of the other methods as mentioned above.

Furthermore, the heating device 104 may be disposed on the rigid region 114, and the heat-weak device 105 may be disposed on the flexible region 113. Specifically, the heating device 104 is disposed on the metal core substrate 112 having the second circuit layer 103 of the rigid region 114, and the heat-weak device 105 is disposed on the flexible substrate 106 having the first circuit layer 107 of the flexible region 113.

The heating device 104 is a device for generating much heat, for instance, a light emitting diode. The heat-weak device 105 is a device the functionality of which is easily deteriorated by heat. When the heat-weak device 105 is subjected to heat, it becomes impossible or improper to operate, and the product reliability is undesirably reduced.

In the case where the heating device 104 is disposed on the rigid region 114, heat generated from the heating device 104 is rapidly dissipated by the metal core 101. Furthermore, the rigid region 114 and the flexible region 113 are connected by means of the flexible substrate 106. Because heat conductivity of the flexible substrate 106 is not high, heat emitted through the metal core 101 is not transferred to the flexible region 113. Accordingly, a heat-weak device 105 on the flexible region 113 is not damaged by heat generated from the heating device 104 and may be spared therefrom. Again, though the rigid region 114 and the flexible region 113 are connected by means of the first circuit layer 107 which is a conductor, the transfer of heat through the first circuit layer 107 is insignificant, and therefore a thermal separation effect of the rigid region 114 and the flexible region 113 is exhibited.

Although FIG. 3 illustrates the rigid-flexible circuit board 100a including the rigid-flexible regions, rigid-flexible-rigid regions or flexible-rigid-flexible regions may be provided.

Although not seen in FIG. 3, a through hole (not shown) may be formed between metal core substrates 112 respectively situated on one surface and the other surface of the flexible substrate 106, so that one surface and the other surface may be electrically connected.

Figure 4:
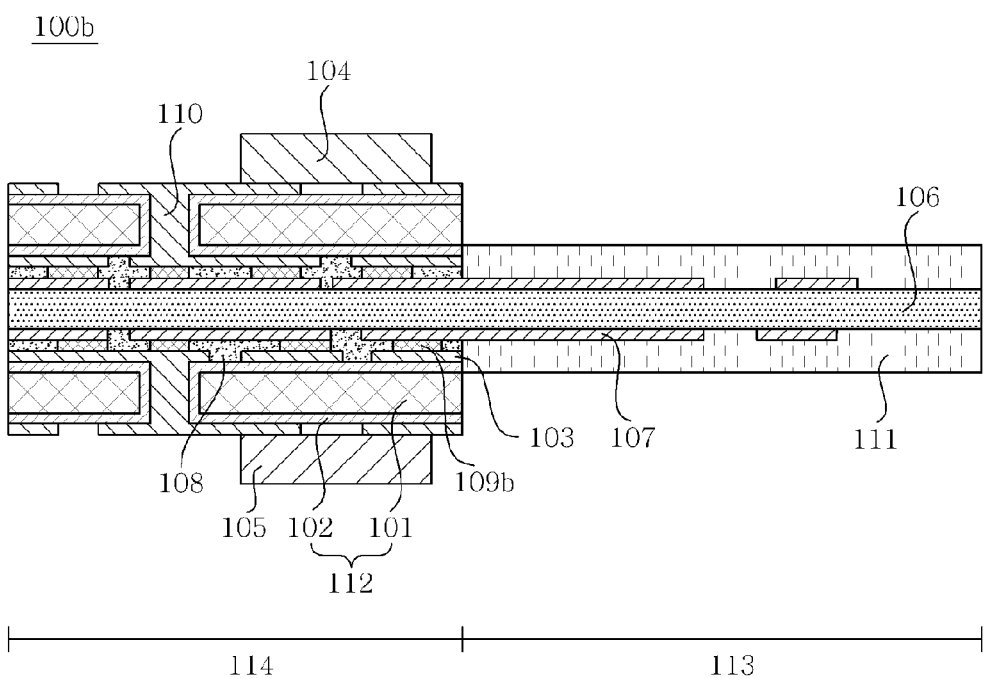
FIG. 4 is a cross-sectional view showing a rigid-flexible circuit board according to a second embodiment of the present invention.

FIG. 4 is a cross-sectional view showing a rigid-flexible circuit board 100b according to a second embodiment of the present invention. With reference to this drawing, the rigid-flexible circuit board 100b according to the present embodiment is described below. In the description of the present embodiment, elements which are the same as or similar to those of the previous embodiment are designated by the same reference numerals, and redundant descriptions thereof are omitted.

As shown in FIG. 4, the rigid-flexible circuit board 100b according to the present embodiment includes a rigid region 114 and a flexible region 113 as in the first embodiment, with the exception that a heating device 104 is disposed on one surface of the rigid region 114 and a heat-weak device 105 is disposed on the other surface of the rigid region 114. Specifically, the heating device 104 is disposed on a metal core substrate 112 having a second circuit layer 103 bonded to one surface of the rigid region 114, and the heat-weak device 105 is disposed on a metal core substrate 112 having a second circuit layer 103 bonded to the other surface of the rigid region 114.

In the case where the heating device 104 is disposed on one surface of the rigid region 114, heat is rapidly dissipated through the metal core 101. Also, because the flexible substrate 106 has low heat transfer efficiency, almost all of the heat emitted through the metal core 101 formed on one surface of the rigid region 114 is not transferred to the other surface of the rigid region 114. Thus, the heat-weak device 105 disposed on the other surface of the rigid region 114 is not damaged by heat generated from the heating device 104 and may be spared therefrom.

In the present embodiment, because the heating device 104 and the heat-weak device 105 are respectively disposed on one and the other surface of the rigid region 114, the metal core substrate 112 may be formed on both surfaces of the flexible substrate 106.

Method of Manufacturing Rigid-Flexible Circuit Board

With reference to FIGS. 5 to 9, the method of manufacturing the rigid-flexible circuit board 100a according to the first embodiment of the present invention is described below.

Figure 5:
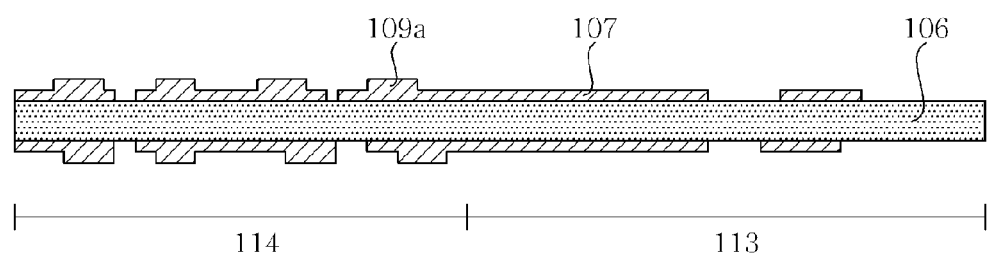
FIGS. 5 to 9 are cross-sectional views sequentially showing a process of manufacturing the rigid-flexible circuit board of FIG. 3.

First, as shown in FIG. 5, a first circuit layer 107 is formed on a flexible substrate 106. As such, although the first circuit layer 107 may be formed only on one surface of the flexible substrate 106, in order to use the rigid-flexible circuit board 100a as a double-sided substrate, the first circuit layer 107 may be formed on both surfaces of the flexible substrate 106.

Although FIG. 5 illustrates a first circuit layer 107 having a stepped shape, a connection means other than the stepped shape may be formed on the first circuit layer 107, or a connection means may be formed not on the first circuit layer 107 but on the second circuit layer 103. The present embodiment describes the case where the first circuit layer 107 is formed in a stepped shape, and the case where a bump is provided on the first circuit layer 107 according to the second embodiment will be described later.

Figure 6:
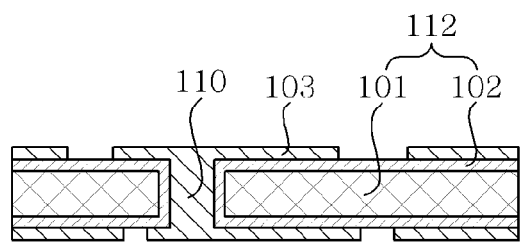

Next, as shown in FIG. 6, an insulating layer 102 is formed on the surface of a metal core 101 having a through hole 110, and a second circuit layer 103 is formed on the metal core 101 having the insulating layer 102, thus providing a metal core substrate 112.

Specifically, the through hole 110 is formed in the metal core 101, and the insulating layer 102 is formed on both the entire surface of the metal core 101 and the inner surface of the through hole 110. As such, the metal core 101 may be a metal substrate including aluminum. In this case, the insulating layer 102 may be a metal anodizing layer formed by anodizing the metal core 101. Subsequently, a typical circuit forming process is used to form the second circuit layer 103 on the insulating layer 102. The second circuit layer 103 may be formed on both surfaces of the metal core substrate 112.

Figure 7:
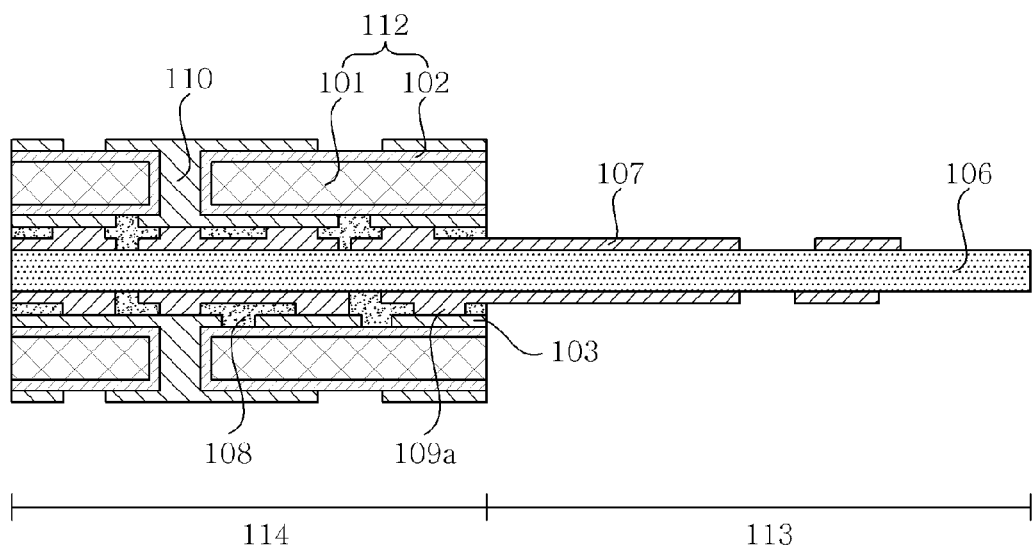

Next, as shown in FIG. 7, an adhesive layer 108 is applied on both surfaces of the rigid region 114 of the flexible substrate 106 having the first circuit layer 107, and the metal core substrate 112 having the second circuit layer 103 is formed on the adhesive layer 108.

As such, the protrusion 109a of the first circuit layer 107 formed in a stepped shape to may be connected to the second circuit layer 103, so that the first circuit layer 107 and the second circuit layer 103 are electrically connected to each other.

Figure 8:
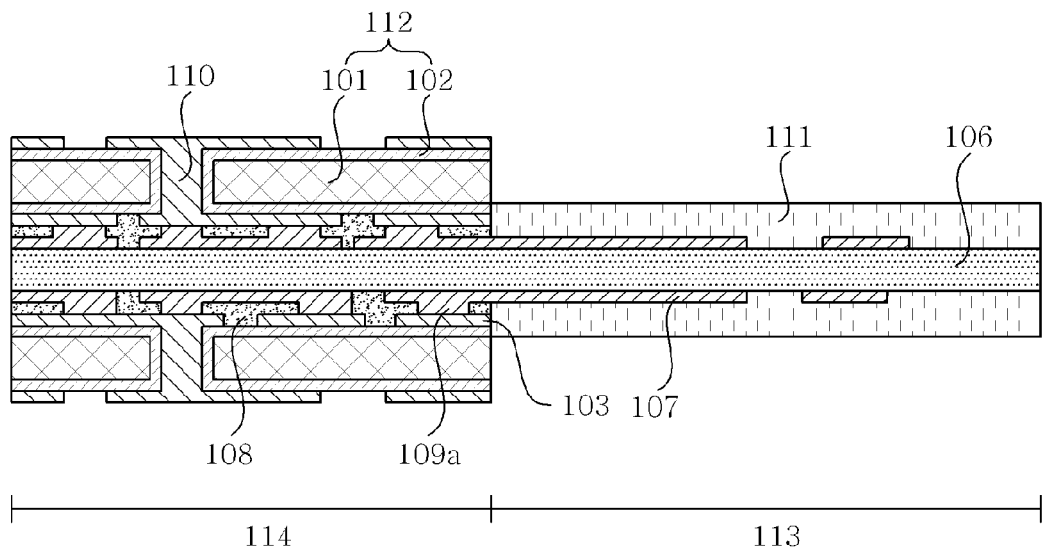

Next, as shown in FIG. 8, a protective layer 111, for example, a coverlay film made of polyimide, may be further formed on both surfaces of the flexible region 113 of the flexible substrate 106 having the first circuit layer 107.

In particular, in the case of the flexible region 113, it may be curved or flexible in order to increase the degree of freedom with which it may be designed. As such, the first circuit layer 107 may be directly exposed and thus damaged. For this reason, the protective layer 111 is formed on the flexible region 113 of the flexible substrate 106 to protect the first circuit layer 107.

Figure 9:
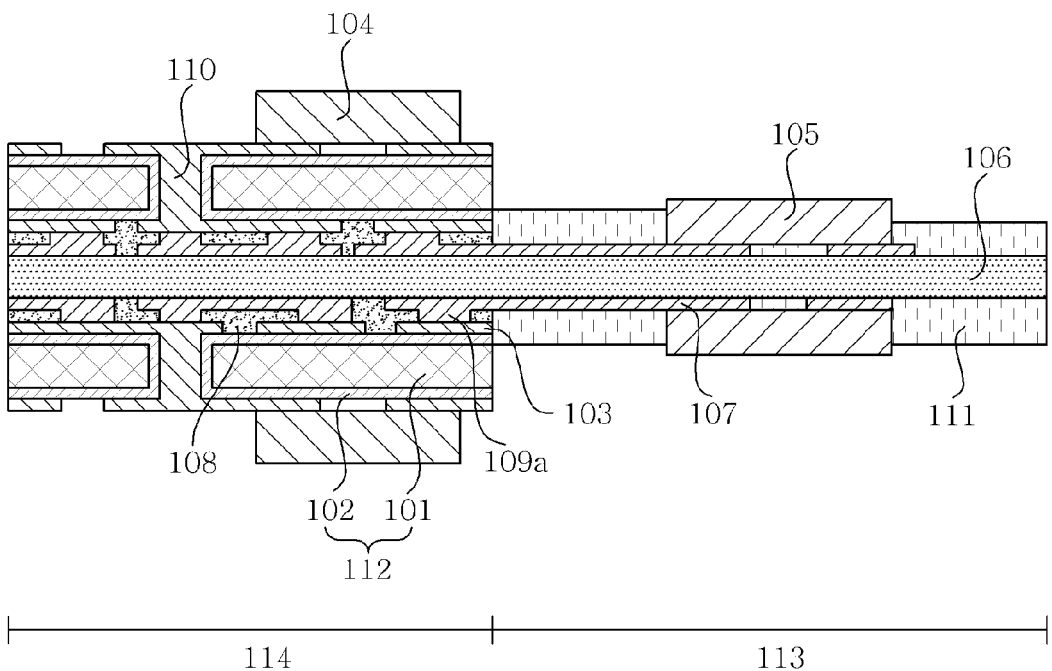

Next, as shown in FIG. 9, a heating device 104 may be disposed on the rigid region 114, and a heat-weak device 105 may be disposed on the flexible region 113.

The rigid-flexible circuit board 100a according to the first embodiment, as shown in FIG. 9, is manufactured by the above manufacturing process.

With reference to FIGS. 10 to 14, the method of manufacturing the rigid-flexible circuit board 100b according to the second embodiment of the present invention is described below. In the description of the present embodiment, elements which are the same as or similar to those of the previous embodiment are designated by the same reference numerals, and redundant descriptions thereof are omitted.

Figure 10:
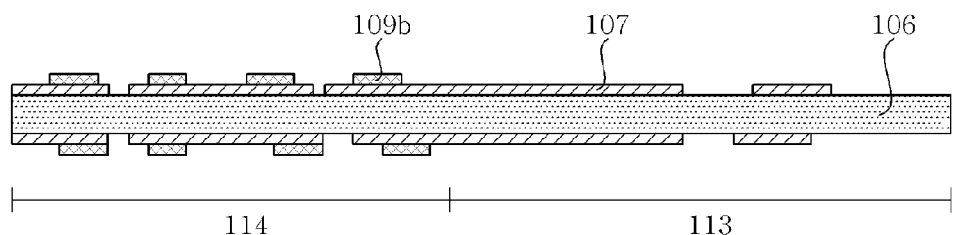
FIGS. 10 to 14 are cross-sectional views sequentially showing a process of manufacturing the rigid-flexible circuit board of FIG. 4.

First, as shown in FIG. 10, a first circuit layer 107 is formed on a flexible substrate 106, and also bumps 109b are formed on the first circuit layer 107. The bumps 109b may be formed using a typical process known in the art. Although FIG. 10 illustrates bumps 109b having a quadrangular shape, the present invention is not limited thereto. The bumps 109b may be formed to have a circular or semicircular shape. Also, the bumps 109b should be made of a conductor enabling electrical connection.

Figure 11:
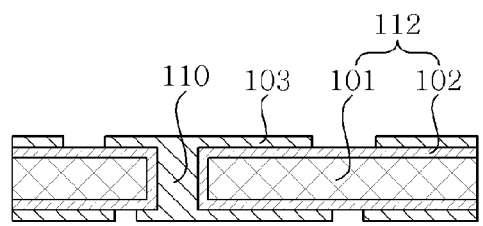

Next, as shown in FIG. 11, a metal core substrate 112 having a second circuit layer 103 is provided.

Figure 12:
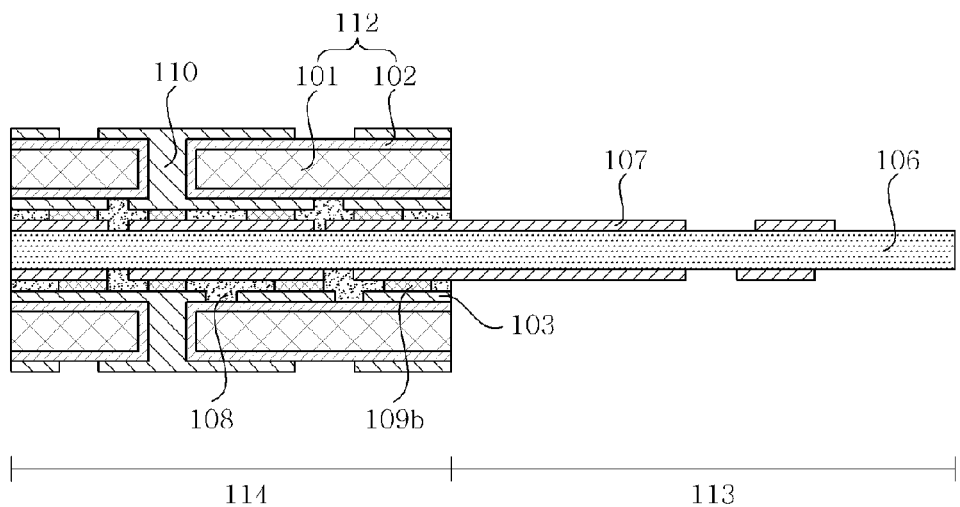

Next, as shown in FIG. 12, the metal core substrate 112 having the second circuit layer 103 may be bonded onto both surfaces of the rigid region 114 of the flexible substrate 106 having the first circuit layer 107 using an adhesive layer 108. As such, the bumps 109b of the first circuit layer 107 are connected to the second circuit layer 103. That is, the first circuit layer 107 and the second circuit layer 103 are electrically connected to each other through the bumps 109b.

Figure 13:
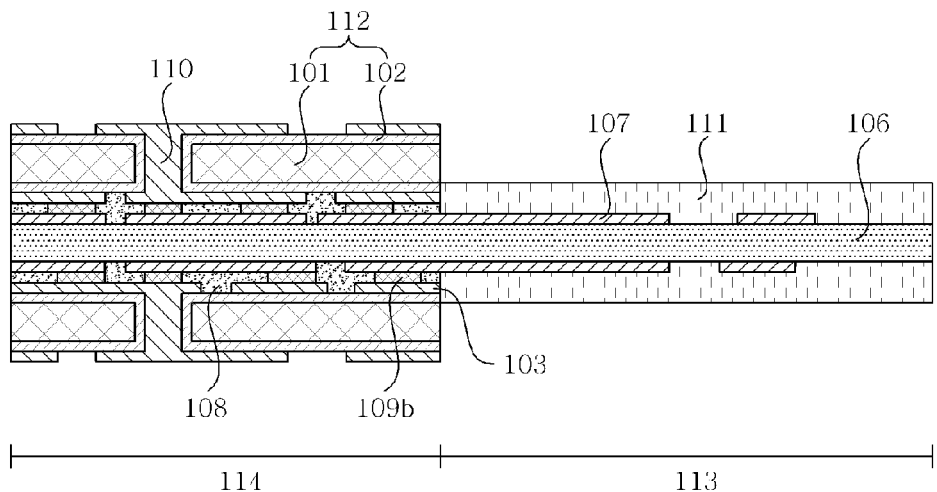

Next, as shown in FIG. 13, a protective layer 111 is also formed on the flexible region 113, to protect the first circuit layer 107.

Figure 14:
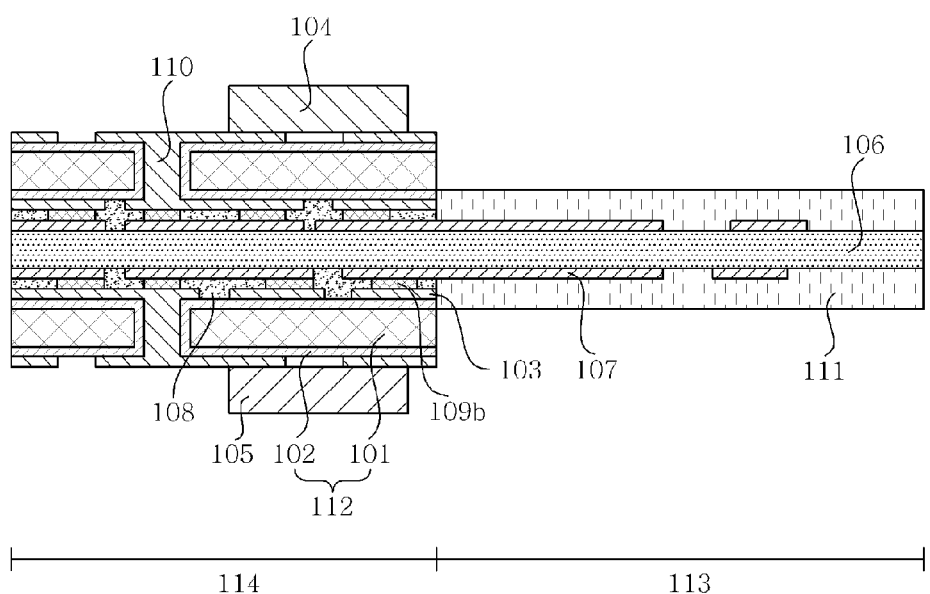

Next, as shown in FIG. 14, a heating device 104 may be disposed on one surface of the rigid region 114, and a heat-weak device 105 may be disposed on the other surface of the rigid region 114.

The present embodiment illustratively describes the formation of the bumps 109b on the first circuit layer 107. Alternatively, the bumps may be formed on the second circuit layer 103, or the bumps may be interposed between the first circuit layer 107 and the second circuit layer 103 when the metal core substrate 112 is bonded to the rigid region 114 of the flexible substrate 106. Also, the stepped shape of the first embodiment may be utilized.

The rigid-flexible circuit board 100b according to the second embodiment, as shown in FIG. 14, is manufactured by the above manufacturing process.

As described hereinbefore, the present invention provides a rigid-flexible circuit board and a method of manufacturing the same. According to the present invention, the rigid-flexible circuit board includes a rigid region and a flexible region which are separated from each other. The rigid region includes a metal core, thus improving heat dissipation properties of a heating device, and the rigid region and the flexible region are thermally separated from each other, thus protecting a heat-weak device.

Also, according to the present invention, a flexible substrate is used thus improving flexibility, thereby increasing the degree of freedom of the design of the flexible region.

Also, according to the present invention, a first circuit layer or a second circuit layer having a stepped shape is provided, so that the first circuit layer and the second circuit layer may be electrically connected to each other.

Also, according to the present invention, a bump is provided to connect the first circuit layer and the second circuit layer to each other, so that the first circuit layer and the second circuit layer may be electrically connected to each other.

Although the embodiments of the present invention regarding the rigid-flexible circuit board and the method of manufacturing the same have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A rigid-flexible circuit board, comprising a rigid region and a flexible region, the rigid region comprising:

A flexible substrate having a first circuit layer on both surfaces thereof;

A metal core substrate formed directly on the flexible substrate and having a second circuit layer on both surfaces thereof, the metal core substrate including a metal core having a through hole and an insulating layer formed on a surface of the metal core including being formed on the through hole; and An adhesive layer disposed between the flexible substrate and the metal core substrate.

2. The rigid-flexible circuit board as set forth in claim 1, further comprising a connection means for connecting the first circuit layer and the second circuit layer.

3. The rigid-flexible circuit board as set forth in claim 2, wherein the first circuit layer or the second circuit layer has a stepped shape, and the connection means includes a protrusion of the first circuit layer or the second circuit layer which has the stepped shape.

4. The rigid-flexible circuit board as set forth in claim 2, wherein the connection means includes a bump.

5. The rigid-flexible circuit board as set forth in claim 1, wherein the metal core comprises a metal including aluminum, and the insulating layer comprises a metal anodizing layer.

6. The rigid-flexible circuit board as set forth in claim 1, wherein the flexible substrate comprises polyimide.

7. The rigid-flexible circuit board as set forth in claim 1, further comprising a heating device mounted on the rigid region and a heat-weak device mounted on the flexible region.

8. The rigid-flexible circuit board as set forth in claim 1, further comprising a heating device mounted on one surface of the rigid region and a heat-weak device mounted on the other surface of the rigid region.

9. A method of manufacturing a rigid-flexible circuit board, comprising:

providing a flexible substrate having a first circuit layer on both surfaces thereof;

forming an insulating layer on a surface of a metal core and on a through hole in the metal core, and forming a second circuit layer on the metal core having the insulating layer, thus providing a metal core substrate having the second circuit layer on both surfaces thereof; and forming an adhesive layer on both surfaces of a portion which is to be a rigid region among a rigid and a flexible region of the flexible substrate having the first circuit layer, and forming the metal core substrate having the second circuit layer directly on the adhesive layer.

10. The method as set forth in claim 9, further comprising (D) forming a protective layer on both surfaces of a portion which is to be the flexible region among the rigid region and the flexible region of the flexible substrate having the first circuit layer.

11. The method as set forth in claim 9, further comprising connecting the first circuit layer and the second circuit layer using a connection means.

12. The method as set forth in claim 11, wherein the first circuit layer or the second circuit layer has a stepped shape, and the connection means includes a protrusion of the first circuit layer or the second circuit layer which has the stepped shape.

13. The method as set forth in claim 11, wherein the connection means includes a bump.

14. The method as set forth in claim 9, wherein (B) comprises:

(B1) providing a metal core comprising a metal including aluminum;

(B2) anodizing the metal core, thus forming an insulating layer comprising a metal anodizing layer on the metal core; and (B3) forming the second circuit layer on the metal core having the insulating layer.

15. The method as set forth in claim 9, wherein the flexible substrate comprises polyimide.

16. The method as set forth in claim 9, further comprising (D) disposing a heating device on the rigid region and disposing a heat-weak device on the flexible region.

17. The method as set forth in claim 9, further comprising (D) disposing a heating device on one surface of the rigid region and disposing a heat-weak device on the other surface of the rigid region.

* * * * *